(12) United States Patent
Rasbornig et al.

(10) Patent No.: US 10,163,763 B1
(45) Date of Patent: Dec. 25, 2018

(54) INTEGRATED CIRCUIT PACKAGE WITH MULTI-DIE COMMUNICATION

(71) Applicant: Infineon Technologies AG, Neubiberg (DE)

(72) Inventors: Friedrich Rasbornig, Klagenfurt (AT); Wolfgang Granig, Seeboden (AT); Dirk Hammerschmidt, Finkerstein (AT); Hans-Joerg Wagner, Villach (AT); Thomas Zettler, Hoehenkirchen-Siegertsbrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/631,258

(22) Filed: Jun. 23, 2017

(51) Int. Cl.
  *H01L 23/495* (2006.01)
  *H01L 23/538* (2006.01)
  *H01L 25/065* (2006.01)

(52) U.S. Cl.
  CPC .... *H01L 23/49575* (2013.01); *H01L 23/5386* (2013.01); *H01L 25/0655* (2013.01); *H01L 25/0657* (2013.01); *H01L 2225/0651* (2013.01); *H01L 2225/06506* (2013.01)

(58) Field of Classification Search
  CPC ............. H01L 25/0655; H01L 25/0657; H01L 23/49575; H01L 23/5386; H01L 2225/06506; H01L 2225/0651
  See application file for complete search history.

(56) References Cited

U.S. PATENT DOCUMENTS

| | | | |
|---|---|---|---|
| 2013/0169350 A1* | 7/2013 | Whatmough | G01R 31/30 327/530 |
| 2014/0239514 A1* | 8/2014 | Haba | H01L 24/49 257/778 |
| 2016/0209284 A1* | 7/2016 | Takayama | G01L 19/145 |
| 2017/0062066 A1* | 3/2017 | Narai | G11C 16/3436 |

* cited by examiner

*Primary Examiner* — Yosef Gebreyesus
(74) *Attorney, Agent, or Firm* — Schiff Hardin LLP

(57) ABSTRACT

An integrated circuit package having a first die configured to sense a first physical characteristic and provide a first data signal, and a second die, wherein the first die is configured to transmit the first data signal to the second die, and the second die is configured to determine if there is an error in the first die and transmit the result to a controller.

27 Claims, 8 Drawing Sheets

Figure 3A
(communication between dies using capacitive connection via external PCB)

- 310 – 1st die
- 312 – 1st wire
- 320 – 1st isolation layer
- 330 – leadframe
- 350 – 2nd die
- 352 – 2nd wire
- 340 – 2nd isolation layer

Figure 3B

- 330 – leadframe
- 310 – 1st die
- 360 – supply
- PCB
- 380 – external capacitive connection (resistor optional)
- 370 – ground

Figure 4A
(communication between dies using galvanic connection via internal lead frame)

- 410 – 1st die
- 412 – 1st wire
- 420 – 1st isolation layer
- 430 – Lead frame
- 450 – 2nd die
- 452 – 2nd wire
- 440 – 2nd isolation layer

Figure 4B

- 430 – lead frame
- 410 – 1st die
- 460 – supply
- 480 – lead frame galvanic connection
- 470 – ground

Figure 5A
(communication between dies using capacitive connection via internal lead frame)

- 510 – 1st die
- 512 – 1st wire
- 520 – 1st isolation layer
- 530 – Lead frame
- 550 – 2nd die
- 552 – 2nd wire
- 540 – 2nd isolation layer

Figure 5B

- 530 – leadframe
- 510 – 1st die
- 560 – supply
- 580 – lead frame capacitive connection
- 570 – ground

Figure 6A
(communication between dies using optical connection via lead frame or PCB)
600A
610 – 1st die
620 – 1st isolation layer
612 – 1st wire
680 – optical connection
430 – Lead frame
650 – 2nd die
652 – 2nd wire
640 – 2nd isolation layer

Figure 6B
600B
630 – lead frame
610 – 1st die
660 – supply
670 – ground
680 – optical connection

Figure 6C
600C
610 – 1st die
620 – 1st isolation layer
630 – lead frame
680 – optical connection
650 – 2nd die
640 – 2nd isolation layer

Figure 7A
(communication between dies using high-frequency connection via lead frame or PCB)

Figure 9
(die placement on single side of lead frame)

Figure 10
(die-on-die on single side of lead frame)

Figure 11
(dies connected via flip-chip technology)

Figure 12A
(capacitive communication package internally with bonded capacitance on silicon die)

)
INTEGRATED CIRCUIT PACKAGE WITH MULTI-DIE COMMUNICATION

BACKGROUND

The automotive industry adopted the International Organization for Standardization (ISO) 26262 standard in 2011, and since then requirements regarding functional safety have significantly increased, especially with respect to semiconductor products. To meet these increased safety requirements, one solution uses two or more identical silicon dies in one integrated circuit package in order to implement homogenous diversity. A disadvantage of homogenous diversity is that in a worst-case scenario, systematic failures might not be detected.

DETAILED DESCRIPTION

The present disclosure is directed to an integrated circuit package having a silicon die configured to measure a physical characteristic and transmit a corresponding data signal to another die in the same integrated circuit package.

Figure 1A:
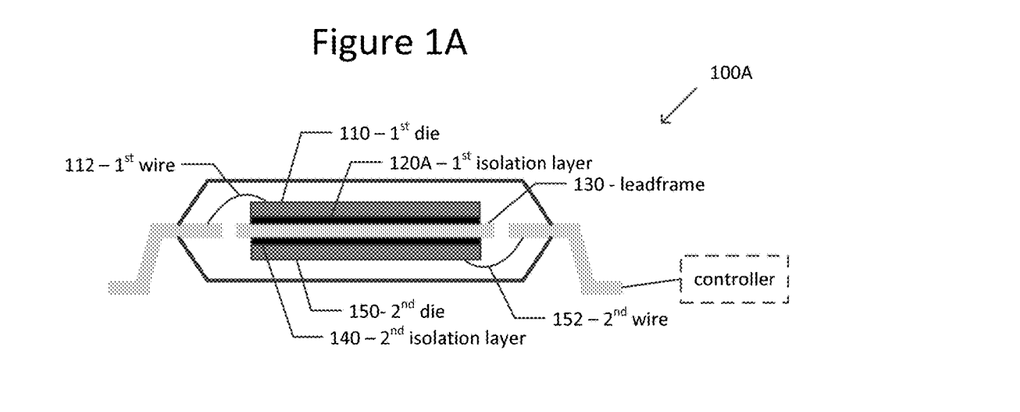
FIG. 1A illustrates a schematic diagram of an integrated circuit package having an isolation layer between each die and a lead frame.

FIG. 1A illustrates a schematic diagram of an integrated circuit package 100A having an isolation layer between each die and a lead frame.

The integrated circuit package 100A comprises a first die 110, a first wire 112, a first isolation layer 120A, a lead frame 130, a second isolation layer 140, a second die 150, and a second wire 152.

The first die 110 is configured to sense a physical characteristic and provide a first data signal. The first die 110 is coupled to the lead frame 130 by the first wire 112. The first isolation layer 120A is located between the first die 110 and the lead frame 130, and is configured to isolate electrically the first die 110 from the lead frame 130.

The second die 150 is located on the opposite side of the lead frame 130 from the first die 110. The second die 150 may also be configured to sense a physical characteristic and provide a second data signal. The second die 150 is coupled to the lead frame 130 by the second wire 152. The second isolation layer 140 is located between the second die 150 and the lead frame 130, and is configured to isolate electrically the second die 150 from the lead frame 130.

One or both of the first and second isolation layers 120, 140 may be realized by forming a separate layer. Alternatively, one or both of the first and second isolation layers 120, 140 may be realized by being deposited on backsides of the first and second dies 120 and 150, respectively.

Figure 1B:
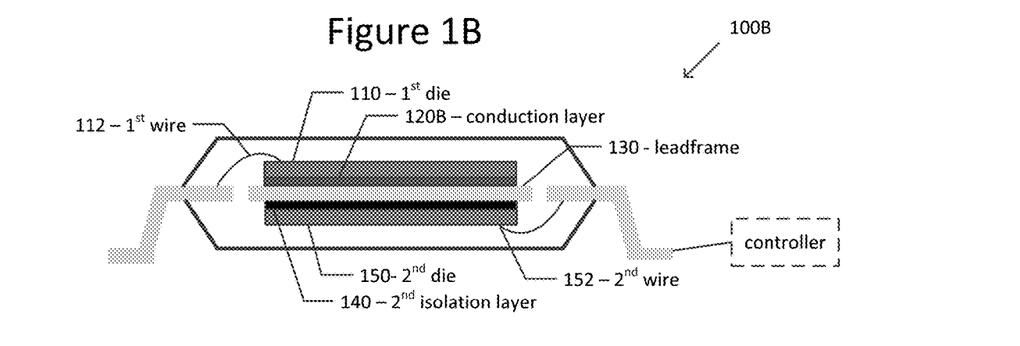
FIG. 1B illustrates a schematic diagram of an integrated circuit package having an isolation layer between one die and a lead frame and a conduction layer between another die and the lead frame.

FIG. 1B illustrates a schematic diagram of an integrated circuit package 100B that is similar to the integrated circuit package 100A of FIG. 1A, except that the first isolation layer 120A is replaced with a conduction layer 120B. Alternatively or additionally, the second isolation layer 150A may be replaced with a conduction layer. A conduction layer is easier and less expensive to manufacture than an isolation layer, and may be realized by being deposited on the backside of the die.

Under normal conditions, the first and second dies 110, 150 may be configured to transmit first and second data signals based on the sensed physical characteristic(s) to an external controller, such as an Electronic Control Unit (ECU). The ECU may then compare the first and second data signal as a redundancy check. The distance between the first and second dies 110, 150 is small (e.g., 100-200 micrometers, depending on the lead frame thickness and isolation layers). If one of the first and second dies 110, 150 is in a short-circuit condition, possibly leading to failure, this die heats up, and the heat influence on the other die is not known to the ECU.

The following aspects of the disclosure permit communication between dies in a same integrated circuit package, thereby increasing diagnostic coverage on a system level.

Figure 2A:
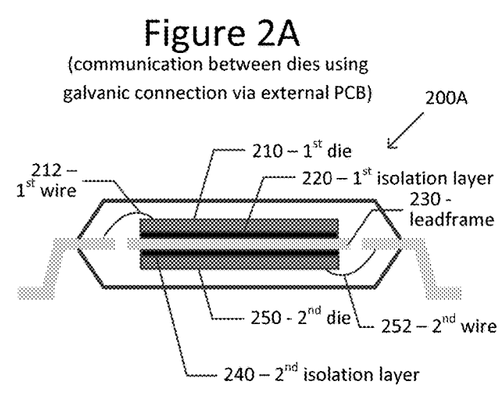
FIGS. 2A and 2B illustrate schematic diagrams of an integrated circuit package having communication between dies using a galvanic connection via an external Printed Circuit Board (PCB) in accordance with an aspect of the disclosure.
Figure 2B:
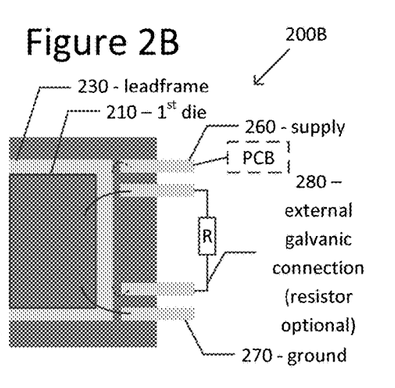

FIGS. 2A and 2B illustrate schematic diagrams of an integrated circuit package 200 having communication between dies using a galvanic connection via an external Printed Circuit Board (PCB) in accordance with an aspect of the disclosure. FIG. 2A is a front view of the integrated circuit package 200A, and FIG. 2B is a partial plan view of the integrated circuit package 200B.

The integrated circuit package 200 comprises a first die 210, a first wire 212, a first isolation layer 220, a lead frame 230, a second isolation layer 240, a second die 250, a second wire 252, a supply pin 260, and a ground pin 270. These elements are similar to the elements described above with respect to FIG. 1A, and for the sake of brevity their descriptions will not be repeated here. Also, any of the isolation layers may be replaced with a conduction layer, as described above with respect to FIG. 1B.

The integrated circuit package 200 differs from the integrated circuit package 100 of FIGS. 1A and 1B in that it additionally comprises between the first die 210 and the second die 250 a communication connection. More specifically, the communication connection is a galvanic connection 280 at least partially via an external PCB (not shown) on which the integrated circuit package 200 is located. The resistor shown in the figure is optional and helps to avoid shirt-circuits between the first and second dies 210, 250. The pins between the supply pin 260 and the ground pin 270, shown in FIG. 2B, may be used to transmit galvanically data signals between the first and second dies 210, 250, and/or signals between one or both of the first and second dies 210, 250 and the ECU. There may be additional pins not shown.

This first die 210 is configured to sense a first physical characteristic and provide a first data signal. The second die 250 may be configured to sense a second physical characteristic and provide a second data signal. The first and second physical characteristics may be a same or different physical characteristics. Each of the first and second physical characteristics may be temperature, stress, current, voltage, magnetic field, torque, pressure, light, radar waves, electromagnetic radiation, inertia, or timing.

The first die 210 is configured to transmit the first data signal to the second die 250 via the galvanic connection, and the second die 250 is configured to determine if there is an error in the first die 210 and transmit the result to the ECU. If the second die 250 is configured to measure a second physical characteristic, and if the first and second physical characteristics are the same physical characteristic, the second die 250 may be configured to compare the first and second data signals to determine if there is an error. For example, if the physical characteristic is temperature, the second die 250 may be configured to compare the first temperature data signal, which represents the temperature of the first die 210, with the second temperature data signal, which represents the temperature of the second die 250, to determine if there is an error. For example, if the temperatures of the two dies 210, 250 are approximately the same, it can be assumed that both of the first and second dies 210, 250 are operating normally. On the other hand, if the temperature of the first die 210 is higher than that of the second die 250 by more than a predetermined amount, it can be assumed that the first die 210 is in failure, and the second die 250 may be configured to transmit the comparison result or other message to the ECU.

Further, each of the first and second dies 210, 250 may sense a physical characteristic and transfer a corresponding data signal to the other die. The physical characteristics sensed by the first and second dies 210, 250 may be the same or different physical characteristics.

Alternatively, the first and second physical characteristics may be different physical characteristics. For example, the first die 210 may transmit its temperature data signal to the second die 250 via the galvanic connection. The second die 250 may be configured to then compare the temperature of the first die 210 to a reference temperature (e.g., 25° C.) to determine if the first die 210 has too high a temperature (e.g., 150° C.) due to an overcurrent and may be failing. The first die 210 could be still be functioning but soon destroyed by the high temperature. In such a case the second die 250 may transmit to the ECU this information, that is, that the first die 210 is failing. Any signals from the failing first die 210 should not be relied upon by the ECU and/or system level measures may be taken (e.g., indication by a warning lamp in a dashboard or activation of an additional safety mechanism). Only signals from the "healthy" second die 250 should be considered by the ECU.

The first and second dies 210, 250 may communicate with each other directly. Alternatively, the first and second dies 210, 250 may communicate with each other under control of the ECU, that is, the ECU may instruct one die to check a condition of the other die in a master-slave relationship.

Data or other signals may be transmitted between the first and second dies 210, 250, thereby increasing diagnostic coverage. In an automotive application, the system then has time to warn the customer before the customer ends up in a critical situation, such as brake failure or loss of steering control.

Figure 3A:
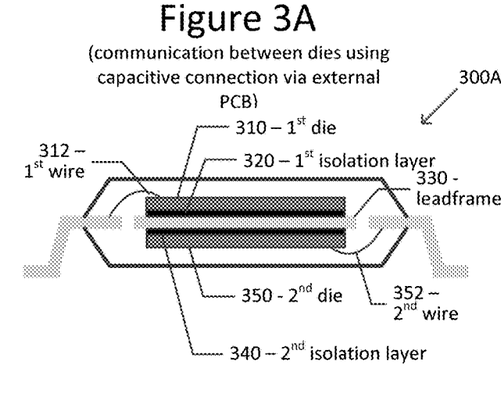
FIGS. 3A and 3B illustrate schematic diagrams of an integrated circuit package having communication between dies using a capacitive connection via an external PCB in accordance with an aspect of the disclosure.
Figure 3B:
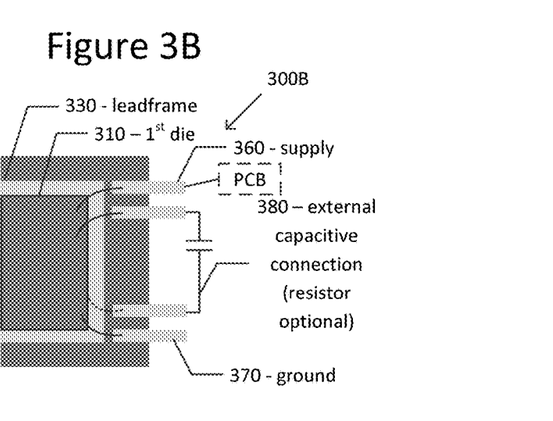

FIGS. 3A and 3B illustrate schematic diagrams of an integrated circuit package 300 having communication between dies using a capacitive connection via an external PCB in accordance with an aspect of the disclosure. FIG. 3A is a front view of the integrated circuit package 300A, and FIG. 3B is a partial plan view of the integrated circuit package 300B.

The integrated circuit package 300 comprises a first die 310, a first wire 312, a first isolation layer 320, a lead frame 330, a second isolation layer 340, a second die 350, a second wire 352, a supply pin 360, and a ground pin 370. These elements are similar to the elements described above with respect to the previous figures, and for the sake of brevity their descriptions will not be repeated here. Also, any of the isolation layers may be replaced with a conduction layer, as described above with respect to FIG. 1B.

The integrated circuit package 300 differs from the integrated circuit package 200 of FIGS. 2A and 2B in that rather than having between the first die 310 and the second die 350 a galvanic connection 280, the integrated circuit package 300 has a capacitive connection 380. Similarly, the external capacitive connection 380 permits the first die 310 and the second die 350 to transmit data signals therebetween via an external PCB. The communication between the first and second dies 310, 350 is otherwise similar to the communication described above with respect to FIGS. 2A and 2B.

Figure 4A:
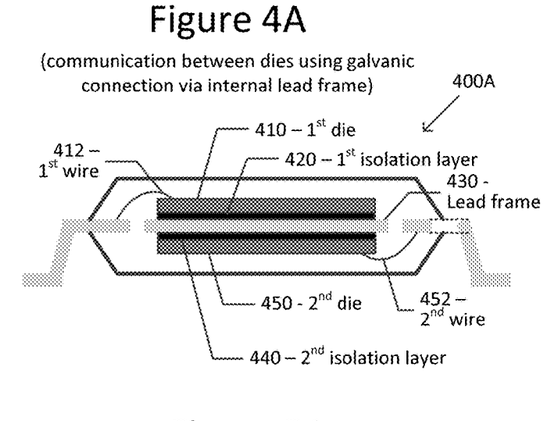
FIGS. 4A and 4B illustrate schematic diagrams of an integrated circuit package having communication between dies using a galvanic connection via an internal lead frame in accordance with an aspect of the disclosure.
Figure 4B:
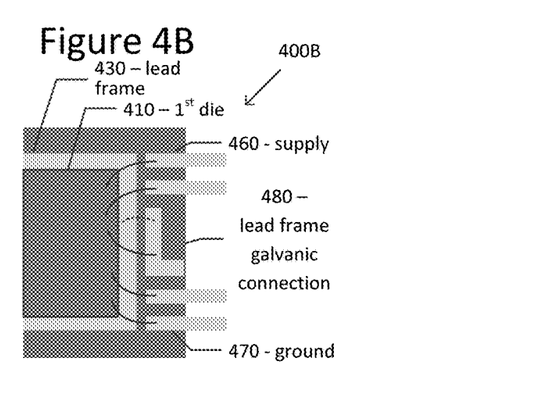

FIGS. 4A and 4B illustrate schematic diagrams of an integrated circuit package 400 having communication between dies using a galvanic connection via an internal lead frame in accordance with an aspect of the disclosure. FIG. 4A is a front view of the integrated circuit package 400A, and FIG. 4B is a partial plan view of the integrated circuit package 400B.

The integrated circuit package 400 comprises a first die 410, a first wire 412, a first isolation layer 420, a lead frame 430, a second isolation layer 440, a second die 450, a second wire 452, a supply pin 460, and a ground pin 470. These elements are similar to the elements described above with respect to previous figures, and for the sake of brevity their descriptions will not be repeated here. Also, any of the isolation layers may be replaced with a conduction layer, as described above with respect to FIG. 1B.

The integrated circuit package 400 differs from the integrated circuit package 200 of FIGS. 2A and 2B in that rather than having the galvanic connection being at least partially via an external PCB, the integrated circuit package 400 comprises a galvanic connection is via the internal lead frame 430. The communication between the first and second dies 510, 550 is otherwise similar to the communication described above with respect to FIGS. 2A and 2B.

Figure 5A:
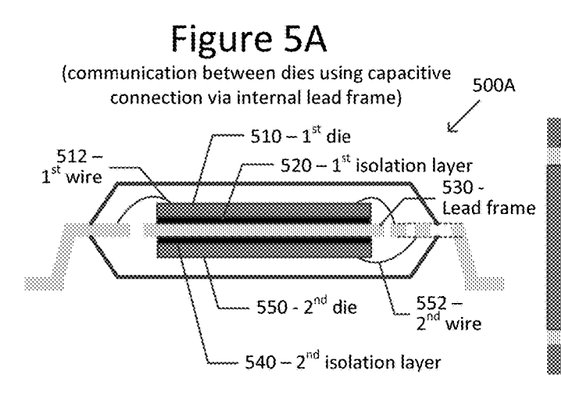
FIGS. 5A and 5B illustrate schematic diagrams of an integrated circuit package having communication between dies using a capacitive connection via an internal lead frame in accordance with an aspect of the disclosure.
Figure 5B:
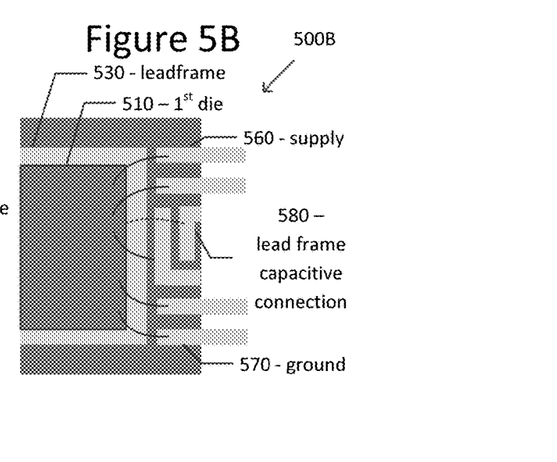

FIGS. 5A and 5B illustrate schematic diagrams of an integrated circuit package 500 having communication between dies using a capacitive connection via an internal lead frame in accordance with an aspect of the disclosure. FIG. 5A is a front view of the integrated circuit package 500A, and FIG. 5B is a partial plan view of the integrated circuit package 500B.

The integrated circuit package 500 comprises a first die 510, a first wire 512, a first isolation layer 520, a lead frame 530, a second isolation layer 540, a second die 550, a second wire 552, a supply pin 560, and a ground pin 570. These elements are similar to the elements described above with respect to previous figures, and for the sake of brevity their descriptions will not be repeated here. Also, any of the isolation layers may be replaced with a conduction layer, as described above with respect to FIG. 1B.

The integrated circuit package 500 differs from the integrated circuit package 300 of FIGS. 3A and 3B in that rather than having the capacitive connection being at least partially via an external PCB, the capacitive connection is via the internal lead frame 530. The communication between the first and second dies 510, 550 is otherwise similar to the communication described above with respect to FIGS. 2A and 2B.

Figure 6A:
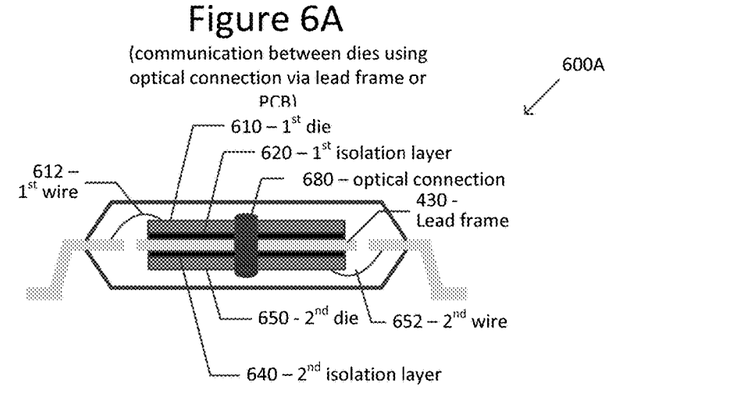
FIGS. 6A, 6B, and 6C illustrate schematic diagrams of an integrated circuit package having communication between dies using an optical connection via an internal lead frame or an external PCB in accordance with an aspect of the disclosure.
Figure 6B:
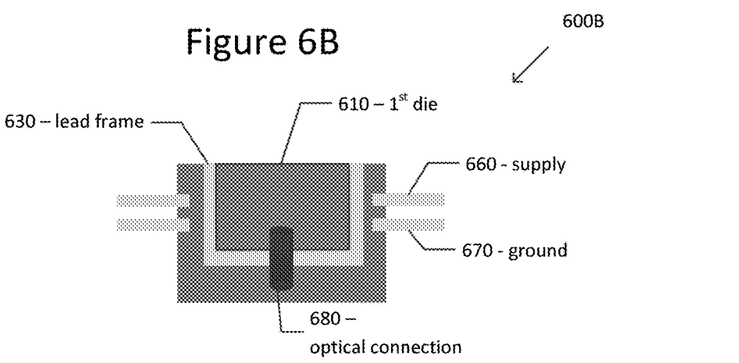
Figure 6C:
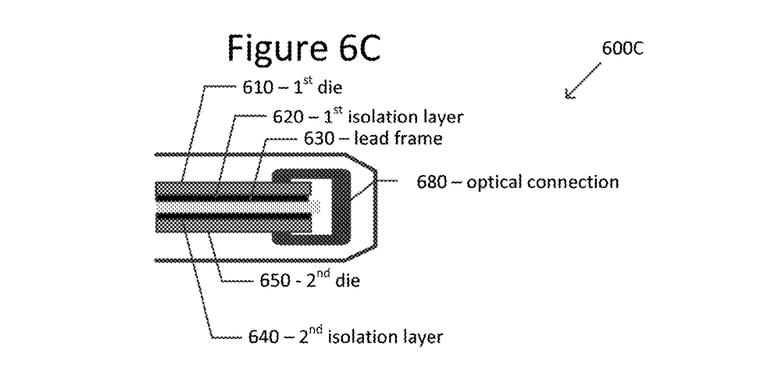

FIGS. 6A, 6B, and 6C illustrate schematic diagrams of an integrated circuit package 600 having communication between dies using an optical connection via an internal lead frame or an external PCB in accordance with an aspect of the disclosure. FIG. 6A is a front view of the integrated circuit package 600A, FIG. 6B is a partial plan view of the integrated circuit package 600B, and FIG. 6C is a side view of the integrated circuit package 600C.

The integrated circuit package 600 comprises a first die 610, a first wire 612, a first isolation layer 620, a lead frame 630, a second isolation layer 640, a second die 650, a second wire 652, a supply pin 660, and a ground pin 670. These elements are similar to the elements described above with respect to previous figures, and for the sake of brevity their descriptions will not be repeated here. Also, any of the isolation layers may be replaced with a conduction layer, as described above with respect to FIG. 1B.

The integrated circuit package 600 differs from the integrated circuit packages described above in that the communication connection between the first die 610 and the second die 650 comprises an optical communication connection 680. The optical communication connection 680 may comprise a fiberglass wire, a Fibre-Plastic (POF) wire, or other similar wire located on the internal lead frame 630. Alternatively, the wire may be located at least partially external to the integrated circuit package 600. The communication between the first and second dies 610, 650 is otherwise similar to the communication described above with respect to FIGS. 2A and 2B.

Figure 7A:
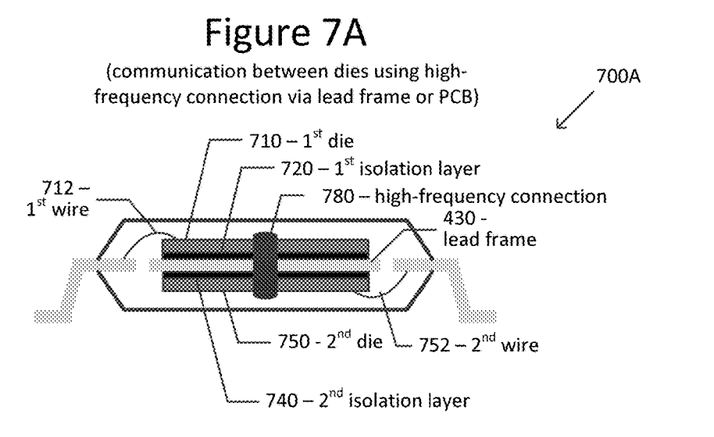
FIGS. 7A, 7B, and 7C illustrate schematic diagrams of an integrated circuit package having communication between dies using a high-frequency connection via an internal lead frame or an external PCB in accordance with an aspect of the disclosure.
Figure 7B:
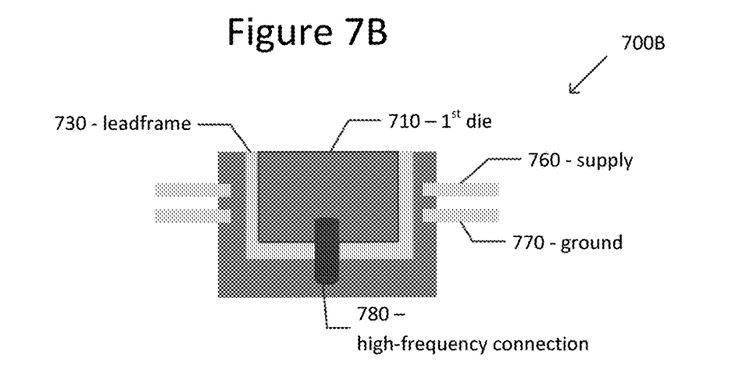
Figure 7C:
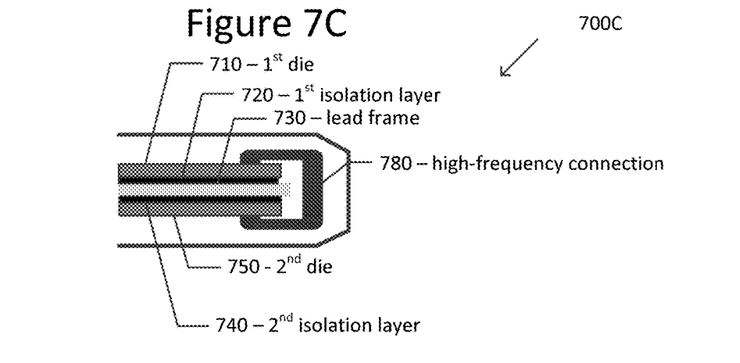

FIGS. 7A, 7B, and 7C illustrate schematic diagrams of an integrated circuit package 700 having communication between dies using an high-frequency connection via an internal lead frame or an external PCB in accordance with an aspect of the disclosure. FIG. 7A is a front view of the integrated circuit package 700A, FIG. 7B is a partial plan view of the integrated circuit package 700B, and FIG. 7C is a side view of the integrated circuit package 700C.

The integrated circuit package 700 comprises a first die 710, a first wire 712, a first isolation layer 720, a lead frame 730, a second isolation layer 740, a second die 750, a second wire 752, a supply pin 760, and a ground pin 770. These elements are similar to the elements described above with respect to previous figures, and for the sake of brevity their descriptions will not be repeated here. Also, any of the isolation layers may be replaced with a conduction layer, as described above with respect to FIG. 1B.

The integrated circuit package 700 differs from the integrated circuit packages described above in that the communication connection between the first die 710 and the second die 750 comprises a high-frequency communication connection 780. The high-frequency communication connection 780, and may comprise a waveguide fibre or other similar wire located on the internal lead frame 730. Alternatively, the wire may be located at least partially external to the integrated circuit package 700. The communications may be in a range of greater than 1 GHz. The communication between the first and second dies 710, 750 is otherwise similar to the communication described above with respect to FIGS. 2A and 2B.

Figure 8A:
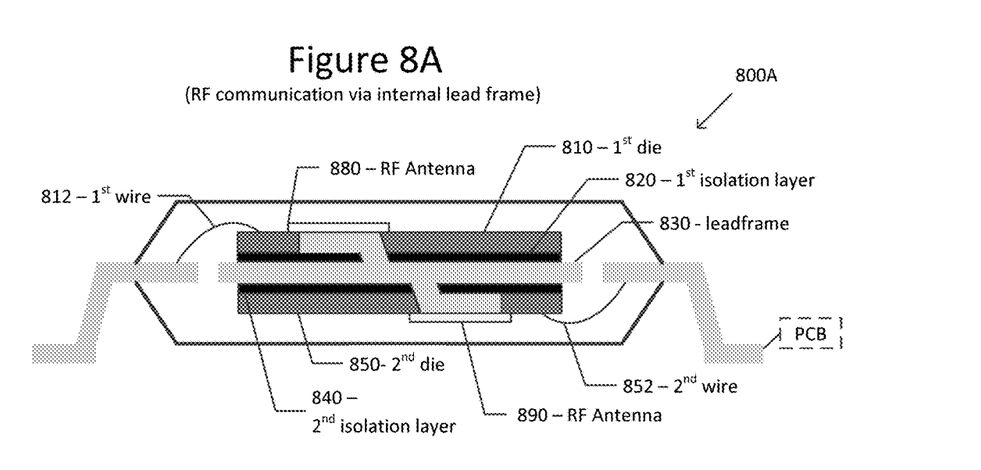
FIGS. 8A and 8B illustrate schematic diagrams of an integrated circuit package having communication between dies using a Radio Frequency (RF) connection via an internal lead frame in accordance with an aspect of the disclosure.
Figure 8B:
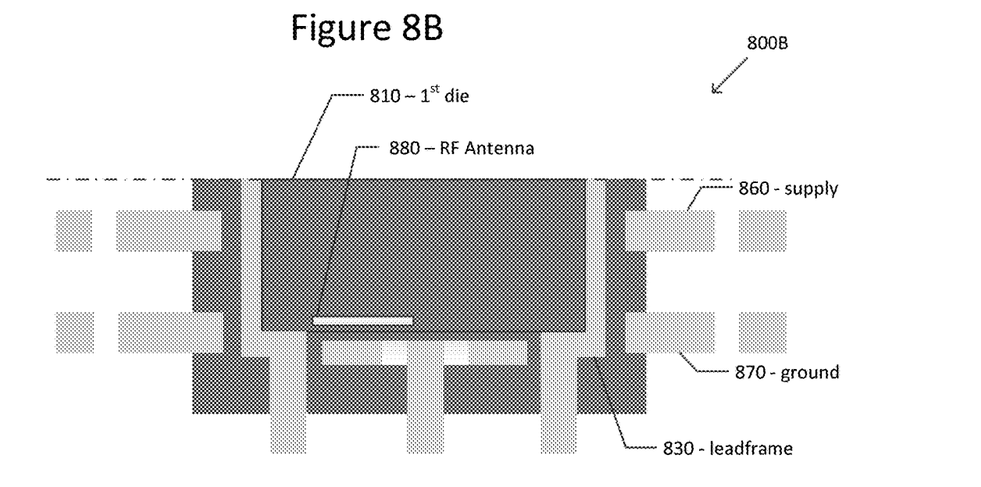

FIGS. 8A and 8B illustrate schematic diagrams of an integrated circuit package 800 having communication between dies using a Radio Frequency (RF) connection via an internal lead frame in accordance with an aspect of the disclosure. FIG. 8A is a front view of the integrated circuit package 800A, and FIG. 8B is a partial plan view of the integrated circuit package 800B.

The integrated circuit package 800 comprises a first die 810, a first wire 812, a first isolation layer 820, a lead frame 830, a second isolation layer 840, a second die 850, a second wire 852, a supply pin 860, and a ground pin 870. These elements are similar to the elements described above with respect to previous figures, and for the sake of brevity their descriptions will not be repeated here. Also, any of the isolation layers may be replaced with a conduction layer, as described above with respect to FIG. 1B.

The integrated circuit package 800 differs from the integrated circuit packages described above in that the communication connection between the first die 810 and the second die 850 comprises a Radio Frequency (RF) communication connection 880. The RF communication connection 880 may comprise the first RF antenna 880 and the second RF antenna 890, which are located on the internal lead frame 830 and communicate by coupling with one another. Alternatively, the first RF antenna 880 and the second RF antenna 890 may be located external to the integrated circuit package 900. The communication between the first and second dies 810, 850 is otherwise similar to the communication described above with respect to FIGS. 2A and 2B.

Figure 9:
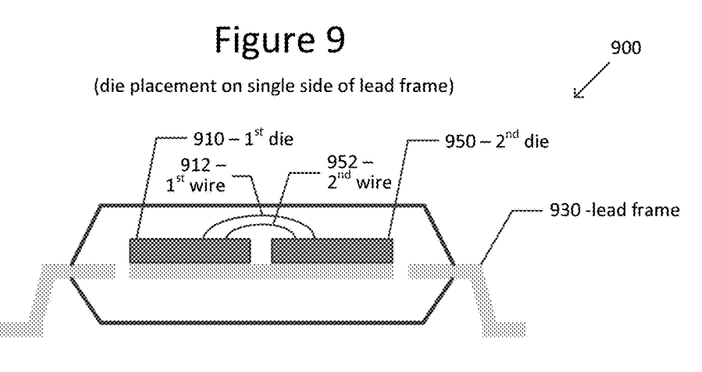
FIG. 9 illustrates a schematic diagram of an integrated circuit package having die placement on a single side of a lead frame in accordance with an aspect of the disclosure.

FIG. 9 illustrates a schematic diagram of an integrated circuit package 900 having die placement on a single side of a lead frame, as opposed to opposite sides, in accordance with an aspect of the disclosure.

The integrated circuit package 900 comprises a first die 910, a first wire 912, a lead frame 930, a second die 950, and a second wire 952. These elements are similar to the elements described above, and for the sake of brevity their descriptions will not be repeated here.

The integrated circuit package 900 differs from integrated circuit packages described above in that rather than being located on opposite sides of the lead frame 930, the first die 910 and the second die 950 are located on a same side of the lead frame 930. While not shown, the integrated circuit package 900 may additionally comprise an isolation layer or a conduction layer between each of the first and second dies 910, 950 and the lead frame 930. Also, any of the integrated circuit packages of FIGS. 2-7 may have their dies formed side-by-side on a same side of the lead frame rather than the opposite sides.

Figure 10:
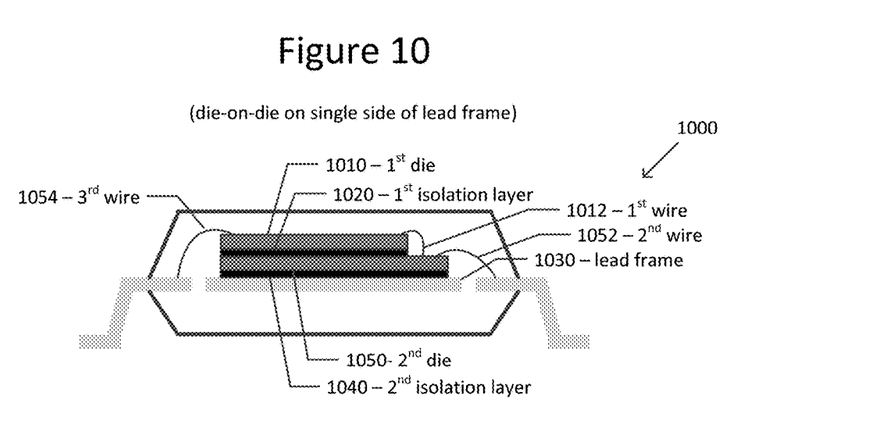
FIG. 10 illustrates a schematic diagram of an integrated circuit package having die-on-die placement on a single side of a lead frame in accordance with an aspect of the disclosure.

FIG. 10 illustrates a schematic diagram of an integrated circuit package 1000 having die-on-die placement on a single side of a lead frame in accordance with an aspect of the disclosure.

The integrated circuit package 1000 comprises a first die 1010, a first wire 1012, a lead frame 1030, a second die 1050, a second wire 1052, a third wire 1054, and a second isolation layer 1040. These elements are similar to the elements described above, and for the sake of brevity their descriptions will not be repeated here.

The integrated circuit package 1000 differs from some of the integrated circuit packages described above in that the first die 1010 and the second die 1050 are located on a same side of the lead frame 1030 and stacked on top of one another in a die-on-die placement. The integrated circuit package 1000 may comprise an isolation layer or a conduction layer between the first die 1010 and the second die 1050, and/or between the second die 1050 and the lead frame 1030. Also, any of the integrated circuit packages of FIGS. 2-7 may have their dies formed on a same side of the lead frame on top of one another.

Figure 11:
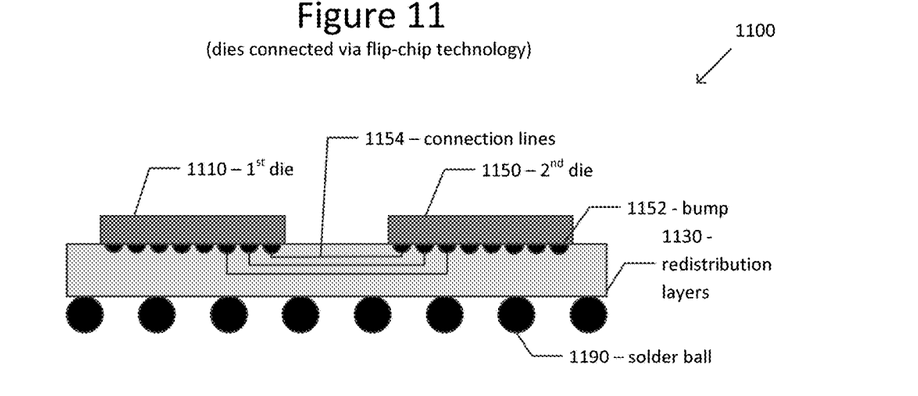
FIG. 11 illustrates a schematic diagram of an integrated circuit package having dies connected via flip-chip technology in accordance with an aspect of the disclosure.

FIG. 11 illustrates a schematic diagram of an integrated circuit package 1100 having dies connected via flip-chip technology in accordance with an aspect of the disclosure.

The integrated circuit package 1100 comprises a first die 1110, a second die 1150, redistribution layers 1130, bumps 1152, connection lines 1154, and solder balls 1190.

The first die 1110 and second die 1150 are formed on the redistribution layers 1130 via conductive bumps 1152, and the conductive bumps 1152 of the first and second dies 1110, 1150 are coupled via electrical connection lines 1154 running through the redistribution layers 1130. The solder balls 1190 are coupled to the bumps 1152 through vias (not shown).

Any of the integrated circuit packages described above with respect to FIGS. 2-8 may have their dies formed using flip-chip technology.

Figure 12A:
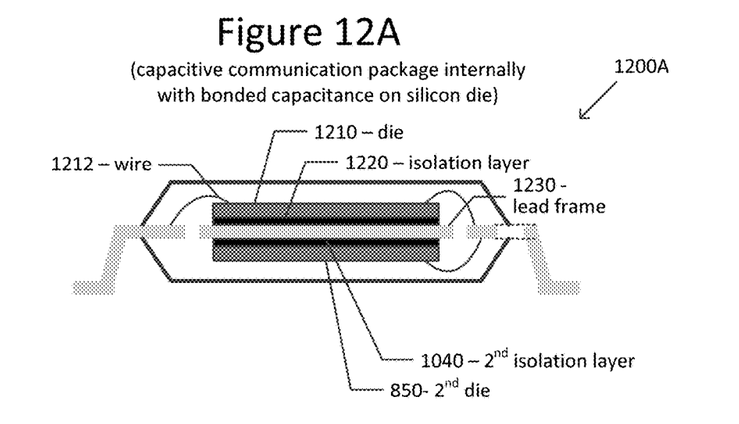
FIGS. 12A, 12B, and 12C illustrate schematic diagrams of an integrated circuit package having communication between integrated circuits located on a same die in accordance with an aspect of the disclosure.
Figure 12B:
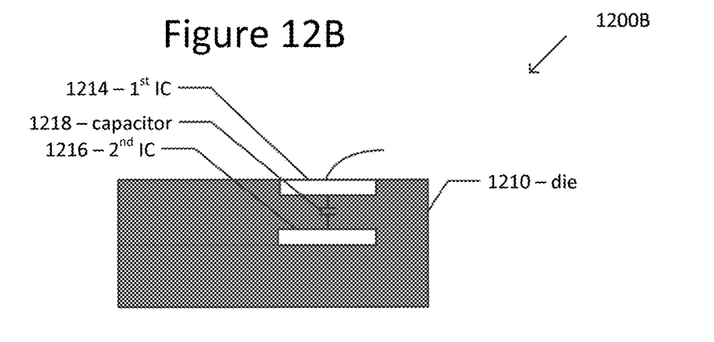
Figure 12C:
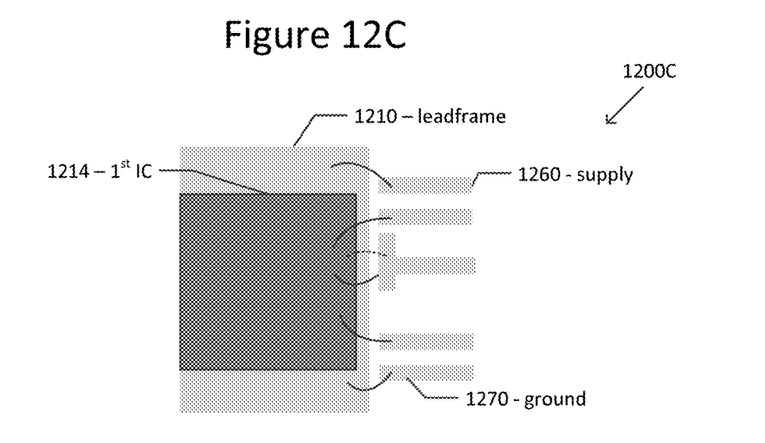

FIGS. 12A, 12B, and 12C illustrate schematic diagrams of an integrated circuit package having communication between integrated circuits located on a same die in accordance with an aspect of the disclosure. FIG. 12A is a front view of the integrated circuit package 1200A, FIG. 12B is a side cross-sectional view of integrated circuits in a die, and FIG. 12C is a partial plan view of the integrated circuit package 1200C.

The integrated circuit package 1200 comprises a die 1210, a wire 1212, an isolation layer 1220, and a lead frame 1230. These elements are similar to the elements described above with respect to previous figures, and for the sake of brevity their descriptions will not be repeated here. Also, the isolation layer 1220 may be replaced with a conduction layer, as described above with respect to FIG. 1B.

The integrated circuit package 1200 differs from the integrated circuit packages described above in that rather than twos dies, one die 1210 comprises two integrated circuits. The two integrated circuits are a first integrated circuit 1214 and a second integrated circuit 1216 communicating via a capacitor 1218 coupled therebetween.

The first integrated circuit 1214 is configured to sense a first physical characteristic and provide a first data signal. The second integrated circuit 1216 may be configured to sense a second physical characteristic and provide a second data signal. The first and second physical characteristics may be the same or different physical characteristics. Other than being between two integrated circuits on a same die rather than being between two dies in a same integrated circuit package, the communication between the first and second integrated circuits 1214, 1216 is otherwise similar to the communication between the first and second dies described above with respect to FIGS. 2A and 2B.

The integrated circuit packages are described as having two dies. However, the disclosure is not limited in this respect. Each of the integrated circuit packages may have any plural number of dies as suitable for the intended purpose.

The subject matter of this disclosure is advantageous in many respects. The diagnostic coverage of safety checks depends on the amount of information which is checked and can be improved by checking more detailed information. Moreover, the probability of undetected corruption of the safety checks is reduced. The communication between dies inside an integrated circuit package enables a higher number of electrical connections than is feasible or commercially viable with die-to-die PCB-based connections or die-to-ECU PCB-based connections.

Internal integrated circuit package connections are especially useful for the exchange of a higher number of analog or radio frequency signals since they cannot be transmitted in serial form over single pins like digital signals. Adding more pins would increase the integrated circuit package and PCB cost. Further, analog and radio frequency signals may be easily disturbed. Further, PCB characteristics are generally not controlled by a semiconductor manufacturer.

Dies in an integrated circuit package may exchange data signals with important information for performance improvement and safety checks. For example, the dies may sense a same physical quantity (e.g., magnetic field of a torque measurement for an electric power steering system). Additionally, physical quantities to perform temperature-compensation and stress-compensation of both dies could be used for plausibility checks between the dies. Increasing the number of electrical check signals between dies in order to reach a higher diagnostic coverage. The number of electrical check signals between dies may be increased in order to obtain higher robustness of checking mechanisms. Also, the disclosure provides undisturbed exchange of analog and/or radio frequency signals die-to-die.

While the foregoing has been described in conjunction with exemplary aspects, it is understood that the term "exemplary" is merely meant as an example, rather than the best or optimal. Accordingly, the disclosure is intended to cover alternatives, modifications and equivalents, which may be included within the scope of the disclosure.

Although specific aspects have been illustrated and described herein, it will be appreciated by those of ordinary skill in the art that a variety of alternate and/or equivalent implementations may be substituted for the specific aspects shown and described without departing from the scope of the present disclosure. This disclosure is intended to cover any adaptations, variations, or combinations of the specific aspects discussed herein.

What is claimed is:

1. An integrated circuit package, comprising:
   a first die configured to sense a first physical characteristic and provide a first data signal; and
   a second die,
   wherein the first die is configured to transmit the first data signal to the second die, and the second die is configured to determine if there is an error in the first die and transmit a result to a controller.

2. The integrated circuit package of claim 1, wherein the second die is configured to sense a second physical characteristic and provide a second data signal, the first and second physical characteristics are the same physical characteristic, and the second die is configured to compare the first and second data signals to determine if there is the error in the first die or an error in the second die.

3. The integrated circuit package of claim 2, wherein if the comparison result is the first and second data signals being different from one another by more than a predetermined amount, the first or second die is in failure, and another of the first or second die is configured to transmit the comparison result to the controller.

4. The integrated circuit package of claim 1, wherein the second die is configured to sense a second physical characteristic and provide a second data signal, the second die is configured to transmit the second data signal to the first die, and the first die is configured to determine if there is an error in the second die and transmit the result to the controller.

5. The integrated circuit package of claim 1, wherein each the first physical characteristic is temperature, stress, current, voltage, magnetic field, torque, pressure, light, radar waves, electromagnetic radiation, inertia, or timing.

6. The integrated circuit package of claim 1, further comprising:
a lead frame;
a first isolation layer located between the first die and the lead frame; and
a second isolation layer located between the second die and the lead frame,
wherein the first and second dies are located on opposite sides of the lead frame.

7. The integrated circuit package of claim 6, further comprising:
a galvanic connection between the first and second dies,
wherein the first die is configured to transmit the first data signal to the second die via the galvanic connection.

8. The integrated circuit package of claim 7, wherein the galvanic connection is at least partially via a printed circuit board on which the integrated circuit package is located.

9. The integrated circuit package of claim 7, wherein the galvanic connection is via the lead frame.

10. The integrated circuit package of claim 6, further comprising:
a capacitive connection between the first and second dies,
wherein the first die is configured to transmit the first data signal to the second die via the capacitive connection.

11. The integrated circuit package of claim 10, wherein the capacitive connection is at least partially via a printed circuit board on which the integrated circuit package is located.

12. The integrated circuit package of claim 10, wherein the capacitive connection is via the lead frame.

13. The integrated circuit package of claim 1, further comprising:
a lead frame;
an isolation layer located between the first die and the lead frame; and
a conducting layer located between the second die and the lead frame,
wherein the first and second dies are located on opposite sides of the lead frame.

14. The integrated circuit package of claim 1, further comprising:
a radio frequency communication connection between the first and second dies,
wherein the first die is configured to transmit the first data signal to the second die via the radio frequency communication connection.

15. The integrated circuit package of claim 14, wherein the radio frequency communication connection comprises antennas located on the lead frame.

16. The integrated circuit package of claim 14, wherein the radio frequency communication connection comprises antennas located external to the integrated circuit package.

17. The integrated circuit package of claim 16, wherein the antennas are located on a printed circuit board on which the integrated circuit package is located.

18. The integrated circuit package of claim 1, wherein the communication connection comprises a waveguide fibre.

19. The integrated circuit package of claim 1, further comprising:
an optical communication connection between the first and second dies,
wherein the first die is configured to transmit the first data signal to the second die via the optical communication connection.

20. The integrated circuit package of claim 19, wherein the optical communication connection comprises a fiberglass wire or a Fibre-Plastic (POF) wire located on the lead frame.

21. The integrated circuit package of claim 19, wherein the optical communication connection comprises a fiberglass wire or a Fibre-Plastic (POF) wire located at least partially external to the integrated circuit package.

22. The integrated circuit package of claim 1, wherein the first and second dies are located on a same side of the lead frame.

23. The integrated circuit package of claim 22, wherein the first and second dies are stacked on top of one another in a die-on-die placement.

24. The integrated circuit package of claim 1, wherein the first and second dies are formed in the integrated circuit package using flip-chip technology.

25. The integrated circuit package of claim 1, wherein the first and second dies are located on opposite sides of the lead frame.

26. An integrated circuit package, comprising:
a die comprising:
a first integrated circuit configured to sense a physical characteristic and provide a data signal; and
a second integrated circuit,
wherein the first integrated circuit is configured to transmit the data signal to the second integrated circuit, and the second integrated circuit is configured to determine if there is an error in the first integrated circuit and transmit a result to a controller.

27. The integrated circuit package of claim 26, wherein the die further comprises:
a capacitive connection between the first and second integrated circuits,
wherein the first integrated circuit is configured to transmit the data signal to the second integrated circuit via the capacitive connection.

* * * * *